US012681870B1

(12) United States Patent
Kumar et al.

(10) Patent No.: US 12,681,870 B1
(45) Date of Patent: Jul. 14, 2026

(54) LOW POWER AREA EFFICIENT ADAPTIVE LOAD COMPENSATION

(71) Applicant: Synopsys, Inc., Sunnyvale, CA (US)

(72) Inventors: Kailash Kumar, Noida (IN); Prateek Singh, Noida (IN); Manoj Kumar, Greater Noida (IN)

(73) Assignee: Synopsys, Inc., Sunnyvale, CA (US)

( * ) Notice: Subject to any disclaimer, the term of this patent is extended or adjusted under 35 U.S.C. 154(b) by 120 days.

(21) Appl. No.: 18/787,717

(22) Filed: Jul. 29, 2024

(51) Int. Cl.
| | |
|---|---|
| *G06F 13/10* | (2006.01) |
| *H03K 3/037* | (2006.01) |
| *H03K 5/24* | (2006.01) |
| *H03K 19/20* | (2006.01) |

(52) U.S. Cl.
CPC ............. *G06F 13/10* (2013.01); *H03K 3/037* (2013.01); *H03K 5/24* (2013.01); *H03K 19/20* (2013.01); *G06F 2213/40* (2013.01)

(58) Field of Classification Search
CPC .......... G06F 13/10; H03K 3/037; H03K 5/24; H03K 19/20
See application file for complete search history.

(56) References Cited

U.S. PATENT DOCUMENTS

| | | | | |
|---|---|---|---|---|
| 2007/0296389 A1* | 12/2007 | Chen | ..................... | H02M 3/158 323/290 |
| 2014/0210545 A1* | 7/2014 | Leibowitz | ............... | G05F 1/462 327/540 |
| 2016/0124030 A1* | 5/2016 | Zhang | .................... | G01R 19/32 324/605 |
| 2021/0373503 A1* | 12/2021 | Morino | ................. | G04F 10/005 |
| 2023/0238949 A1* | 7/2023 | Manjunath | ....... | H03K 19/17744 332/109 |

* cited by examiner

*Primary Examiner* — Phong H Dang

(74) *Attorney, Agent, or Firm* — Patterson + Sheridan, LLP

(57) ABSTRACT

Systems and methods for load compensation are presented to support a wide range of capacitive loads on a pad coupled to an I/O transmitter. The I/O transmitter includes I/O architecture coupled to a pad and a calibration circuit coupled to the I/O architecture. The calibration circuit includes sensing circuitry, pulse generation circuitry coupled to the sensing circuitry and control bit generation circuitry coupled to the pulse generation circuitry. The control bit generation circuitry generates control bits proportional to load variations detected at the pad and feeds the control bits to the I/O architecture to modulate rise and fall times of pulsed signals at the pad.

20 Claims, 9 Drawing Sheets

200

LOW POWER AREA EFFICIENT ADAPTIVE LOAD COMPENSATION

TECHNICAL FIELD

The present disclosure generally relates to load compensation. More specifically, the present disclosure relates to low power area efficient adaptive load compensation.

BACKGROUND

Load compensation in circuits is employed to ensure accuracy and stability of signal transmission, particularly in applications involving input/output (I/O) transmitters. Load compensation is employed to maintain consistent performance despite variations in load conditions, which can affect the voltage and current in circuits.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figures 1A, 1B:
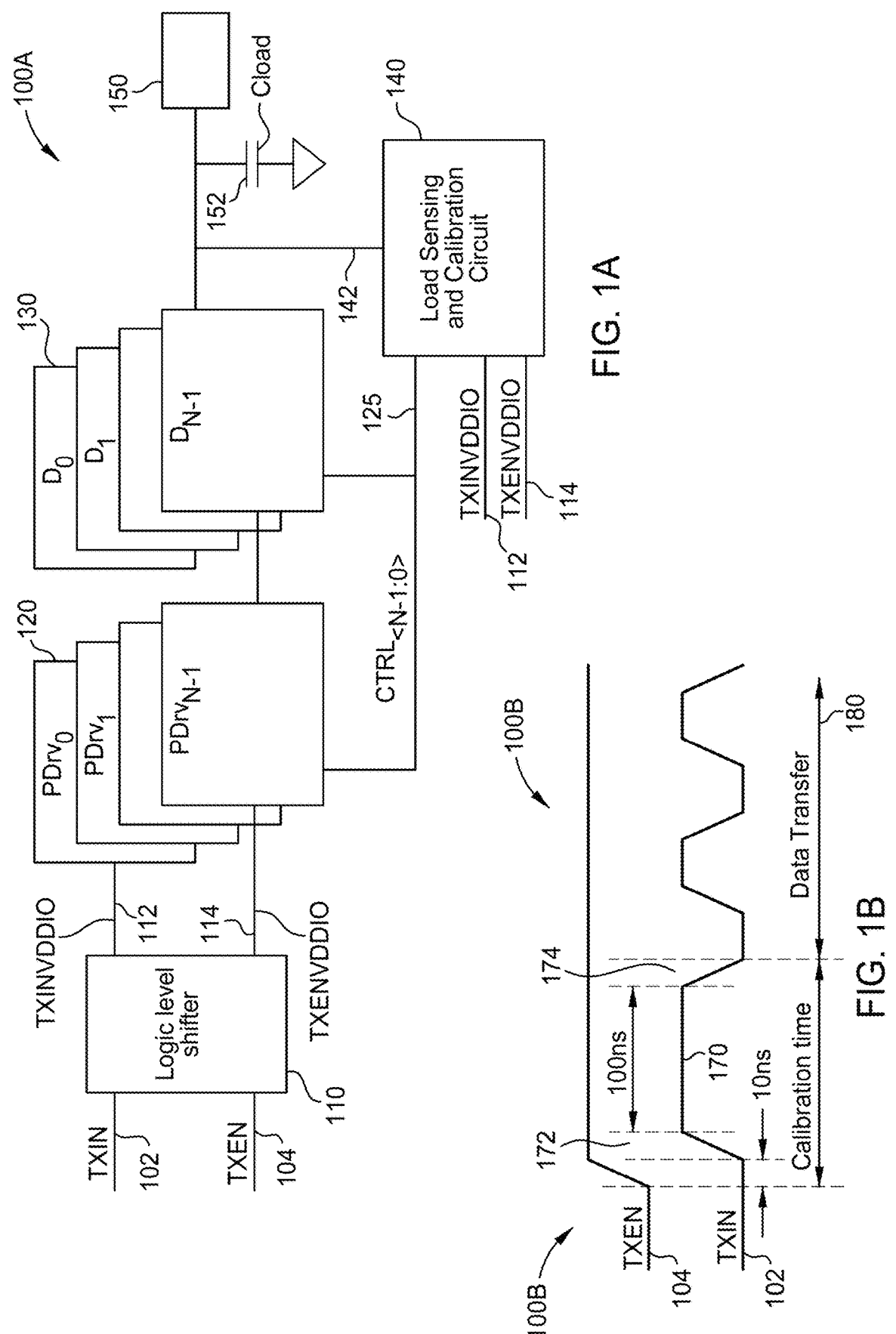
FIG. 1A illustrates an input/output (I/O) transmitter with pad load compensation.
FIG. 1B illustrates a timing diagram of signals received by the I/O transmitter.

Aspects of the present disclosure relate to load compensation, and, in particular, to load compensation in input/output (I/O) transmitters. The present disclosure presents systems and methods for load compensation that support a wide range of capacitive loads on a pad coupled to an I/O transmitter.

I/O transmitters are used to convert physical signals from sensors or other input devices into a standard output signal that may be read and processed by other equipment. I/O transmitters may experience load compensation issues. Load compensation issues pertain to challenges associated with maintaining accurate and reliable signal transmission despite variations in the load connected to the I/O transmitter. Load compensation issues may relate to voltage drops, load impedance variations, power supply variability, temperature effects, and calibration drift, among others.

One element of I/O transmitters that experiences high loads is a pad. The pad serves as a designated surface area for electrical contact between a component and a board. Stated differently, a pad refers to a metallic surface on a printer circuit board (PCB) where components are soldered and mounted. Pads allow components to be affixed to the PCB through soldering and form electrical connections via copper traces. Multiple pads are used in conjunction to generate a component footprint or pattern on the PCB.

High pad loads on PCBs or an I/O transmitter can lead to a variety of issues that can affect the performance, reliability, and longevity of the PCB or the I/O transmitter. Such issues can relate to mechanical stress, electrical failures, thermal issues, solder joint issues, component damage, board warping, signal integrity issues, and reliability concerns.

Thermal issues may include overheating where high current loads can cause the pad to overheat, potentially damaging the pad, the PCB substrate, or nearby components and thermal fatigue where repeated thermal cycling due to high loads can lead to cracks and eventual failure of the pad.

Signal integrity issues may include impedance variations where high loads can cause impedance changes in the pads and traces, affecting signal integrity, especially in high-frequency circuits, and noise and crosstalk, where physical deformation can alter the spacing between traces and pads.

Moreover, reliability concerns include decreased lifespan and increased maintenance. High pad loads can significantly reduce the lifespan of the PCB and its components due to the aforementioned issues. Boards with high pad load issues may need more frequent maintenance and repairs, leading to higher operational costs.

Therefore, measures may be implemented to expand pad load ranges handled by I/O transmitters so that I/O transmitters can support a wider range of pad loads. Pad load compensation is an adaptive load compensation technique in that it is a dynamic method used to automatically adjust and optimize performance in response to varying load conditions. By implementing pad load compensation, circuit designers can reduce energy losses, improve voltage regulation, and minimize the impact of load changes on, e.g., I/O transmitters, as well as other electrical components.

Moreover, typical I/O transmitters are designed for specific loads, and the maximum/minimum (max/min) rise and fall time has around 2 to 3 times variation across process, voltage, and temperature (PVT). For PVT compensated I/O transmitters, the max/min rise and fall time has around 1.2 to 1.5 times variation. When an additional parameter of load range is added, the variation multiplies, thus making it difficult to support, e.g., RFFE/SPI/SPMI protocols with existing solutions.

RFFE is a radiofrequency front-end control interface. RFFE is a two-wire interface for controlling radiofrequency (RF) front-end subsystems that use unterminated, single-ended complementary metal oxide semiconductor (CMOS) I/Os for low power.

SPI is a serial peripheral interface. SPI is a communication interface used to send data between multiple devices. Stated differently, SPI is a synchronous serial communication interface used for short-distance communications.

SPMI is a system power management protocol. SPMI is a two-wire serial interface for advanced power management that connects an integrated power controller of a system-on-chip (SoC) processor system with one or more power management integrated circuits (PMICs). Stated differently, SPMI is a high-speed, low-latency, bi-directional, two-wire serial bus suitable for real-time control of voltage and frequency scaled multi-core application processors and power management of auxiliary components.

RFFE/SPI/SPMI protocols support a wide range of load at the pad. In fact, many protocols, including RFFE/SPI/SPMI, now demand that the interface pad can be connected to one or multiple integrated circuits (ICs) in various applications, leading to an increase in load variation on the pad, whereas the specifications for max/min rise and fall times is stringent. As such, PVT compensated I/O transmitters may take up more area and have more direct current (DC), while still not compensating properly for load variations.

The example embodiments provide for an I/O transmitter that can handle load variations by using a pad transition sensor that generates gate control signals, which are proportional to the load at the pad and fed to the pre-drivers and drivers of the I/O transmitter. Stated differently, the proposed examples track the pad transition, which is depended on the load at the pad and generates control bits/signals for pre-drivers and drivers of the I/O transmitter that modulate the rise and fall times of the pad signals. This results in at least lowering the variability of the transition time and reducing the slew rate. The benefits of using a pad transition sensor to generate control signals proportional to the load of the pad include supporting a wider range of capacitance load at the pad, compensating for process variations, lowering modulated transition times, flexibility to support multiple protocols, no DC current once calibrations has been completed, and further reduction of voltage and temperature variability.

FIG. 1A illustrates an input/output (I/O) transmitter with pad load compensation.

The I/O transmitter 100A includes a logic level shifter 110 that receives a first signal 102 and a second signal 104. The first signal 102 is a TXIN signal and the second signal is a TXEN signal. The TXIN signal is a pulse input signal. The TXIN signal may be based on PVT, where electrical pulses are used with precise control over their duration, amplitude, and frequency to achieve specific effects or functionalities in various applications. Unlike continuous or steady-state voltage, pulsed voltage involves short bursts of voltage applied intermittently. The TXEN is a transmit enable control signal, which enables the I/O transmitter 100A.

The logic level shifter 110 can also be referred to as a voltage level translator. The logic level shifter 110 is an electronic circuit used to safely interface components operating at different voltage levels. The logic level shifter 110 enables communication between devices that operate on different logic levels by shifting the voltage levels from one domain to another without losing the integrity of the signal. The logic level shifter 110 prevents damage to components by ensuring voltage compatibility and preserves the integrity and reliability of digital signals across different voltage domains.

The logic level shifter 110 transmits two signals to pre-drivers 120. The first signal 112 is a TXINVDDIO signal and the second signal 114 is a TXENVDDIO signal. The TXINVDDIO signal is a level shifter version of the TXIN signal. The TXENVDDIO signal is a level shifter version of the TXEN signal. The TXINVDDIO signal (the first signal 112) is logically the same as the pad. However, the TXINVDDIO signal will not see the pad load, and acts as an ideal signal for comparison. The TXENVDDIO signal is used for resetting the pulse generation block and disable generation block described below with reference to FIG. 3.

The pre-drivers 120 provide for an intermediate stage that prepares the first signal 112 and the second signal 114 to be adequately handled by the driver stage. The pre-drivers 120 are used when the initial control signal is not strong enough to directly drive the final power stage. The pre-drivers 120 amplify or condition the first signal 112 and the second signal 114 to a level suitable for the driver stage. This includes adjusting the voltage and current levels. After the signals are processed by the pre-drivers 120, the signals are fed into the drivers 130.

The drivers 130 include, and directly control, high-power switches (e.g., transistors) in a circuit. The drivers 130 provide sufficient voltage and current to switch the high-power device quickly and efficiently. The drivers 130 provide amplification to ensure the transistors operate correctly. The drivers 130 ensure that the transistor switches on and off at desired speeds, minimizing switching losses and preventing issues such as cross-conduction.

Therefore, the pre-drivers 120 prepare and condition the signals for the drivers 130, providing intermediate amplification, isolation, and buffering. The drivers 130 drive the high-power switches or transistors, providing the voltage and current for efficient and fast switching while offering protection and control features.

The drivers 130 transmit electrical signals through the pad 150 to other external circuits or devices. The pad 150 may also be referred to as an I/O pad or an interface pad. The pad 150 is a physical interface where electrical signals enter or exit an integrated circuit (IC), or in this case the I/O transmitter 100A. The pad 150 is designed to handle the electrical and mechanical stress imposed by the drivers 130 and the external loads. The pad 150 may be coupled to a capacitive load or load capacitance 152.

The pre-drivers 120 and the drivers 130 may be coupled to a load sensing and calibration circuit (or calibration circuit 140). The calibration circuit 140 is used to adjust the driver characteristics to match the load optimally. In the instant case, the calibration circuit 140 compensates for variations in the pad load. The calibration circuit 140 may dynamically adjust the driver parameters based on real-time feedback from the pad load, thus ensuring optimal performance under varying load conditions. This helps in maintaining signal integrity and reduces power consumption. The calibration circuit 140 may tune parameters, such as impedance, slew rate, and drive strength. The interplay between the pre-drivers 120, the drivers 130, and the calibration circuit 140 ensures that the signals are transmitted with high integrity, minimal distortion, and optimal power efficiency, while handling wide load variations at the pad load.

The calibration circuit 140 receives the rise and fall times 142 of the pad load. The calibration circuit 140 processes the rise and fall times 142 and generates control bit/signals 125 that are fed back to the pre-drivers 120 and the drivers 130. The control bit/signals 125 enable the pre-drivers 120 and the drivers 130 to modulate the rise and fall times of the I/O signals at the pad load. The calibration circuit 140 also receives the first signal 112 and the second signal 114. The TXINVDDIO signal includes the detected rise and fall times of signals of the pad load and the TXENVDDIO signal indicates to the calibration circuit 140 that the I/O transmitter 100A has been enabled.

Therefore, the I/O transmitter 100A can handle load variations by using a pad transition sensor that generates gate control signals, which are proportional to the load at the pad and fed to the pre-drivers 120 and the drivers 130 of the I/O transmitter 100A. Stated differently, the proposed examples track the pad transition, which is depended on the load at the pad and generates the control bit/signal 125 fed to the pre-drivers 120 and the drivers 130 of the I/O transmitter. The control bit/signal 125 modulate the rise and fall times of the pad load.

FIG. 1B illustrates a timing diagram of signals received by the I/O transmitter.

The timing diagram 100B depicts the second signal 104, which is the TXEN signal. The TXEN is the transmit enable control signal, which enables the I/O transmitter 100A. When the TXEN signal is high, the I/O transmitter 100A is enabled. The timing diagram 100B also depicts the first signal 102, which is the TXIN signal. The TXIN signal provides the signals of the I/O transmitter 100A. The time axis 180 has a calibration period and a data transfer period. In the calibration period, a single pulse 170 is shown having a rise time 172 and a fall time 174. In the data transfer period, there are multiple pulses. During the calibration period, a total time taken to sense the data rising is measured and converted into pulses (i.e., control bit/signals 125) in the data transfer period. The pulses represent the control bit/ signals 125 fed back to the pre-drivers 120 and the drivers 130 to modulate the rise and fall times of the I/O signals at the load on the pad 150 changes. The calibration is performed before the data transfer is performed. As such, the control bit/signals 125 are generated and provided to the pre-drivers 120 and the drivers 130 before data transition commences. Thus, the control bit/signals 125 are set to have a particular rise time and a particular fall time based on the protocol used.

The rise time and fall time of an I/O signal are valuable parameters that describe how quickly the I/O signal transitions from one voltage level to another.

The rise time is the time it takes for a signal to transition from a low voltage level (often defined as 10% of the signal's final value) to a high voltage level (often defined as 90% of the signal's final value). However, the rise time and fall time measurement points can vary from protocol to protocol. For example, in the RFFE protocol, the rise time may be defined as 20% of the signal's first value and the fall time may be defined as 80% of the signal's final value. The rise time is measured in units of time, such as nanoseconds (ns) or microseconds (μs).

The fall time is the time it takes for a signal to transition from a high voltage level (often defined as 90% of the signal's initial value) to a low voltage level (often defined as 10% of the signal's initial value). The fall time is measured in units of time, such as nanoseconds (ns) or microseconds (μs).

Optimum rise and fall times are beneficial for maintaining signal integrity, particularly in high-speed circuit. Accurate timing analysis in digital circuits depends on precise measurements of rise and fall times to ensure that signals meet the timing requirements of different components and interfaces.

The strength of the drivers 130 affect rise and fall times. Stronger drivers can achieve faster transitions. Further, the capacitance of the load (i.e., the load capacitance 152) being driven by the signal affects rise and fall times. Higher capacitance results in slower transitions. The rise and fall times vary for different protocols. As such, in order to accommodate multiple protocols, the rise and fall time variations resulting from the pad load variations are continuously monitored and compensated by using the calibration circuit 140.

Figure 2A:
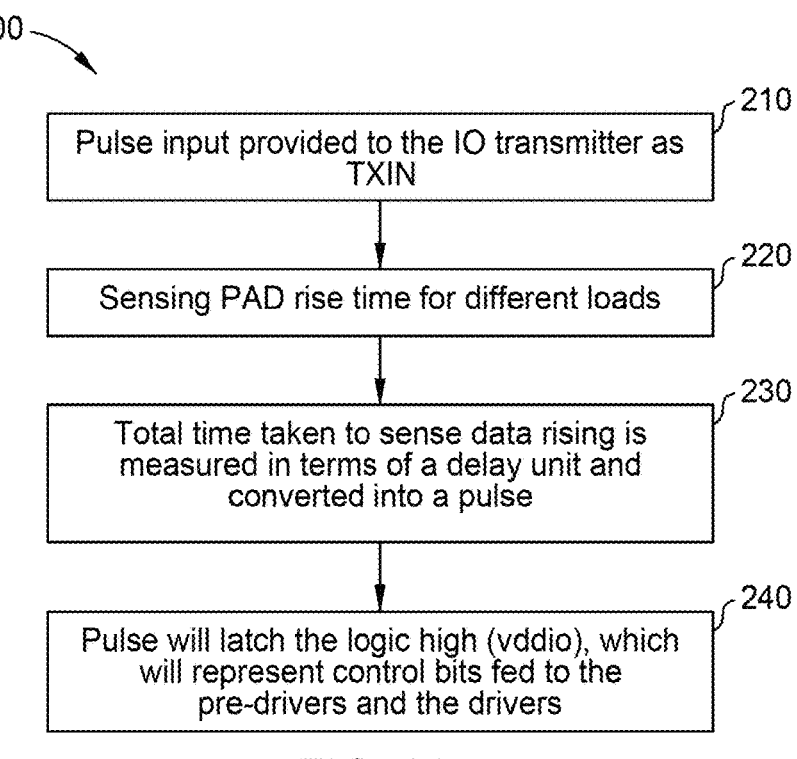
FIG. 2A illustrates a flowchart for implementing pad load compensation to the I/O transmitter.

FIG. 2A illustrates a flowchart 200 for implementing pad load compensation to the I/O transmitter.

At block 210, a pulse input is provided to the I/O transmitter 100A as the signal TXIN (i.e., first signal 102). As such, the I/O transmitter 100A received pulsed voltages.

At block 220, a rise time for different loads on the pad 150 is sensed. Rise time refers to the time it takes for the signal to transition from a low voltage level to a high voltage level. Different loads can impact the rise time. For example, capacitive loads slow down the rise time because the drivers 130 charge the capacitance. The larger the capacitance, the larger the rise time.

Figure 3:
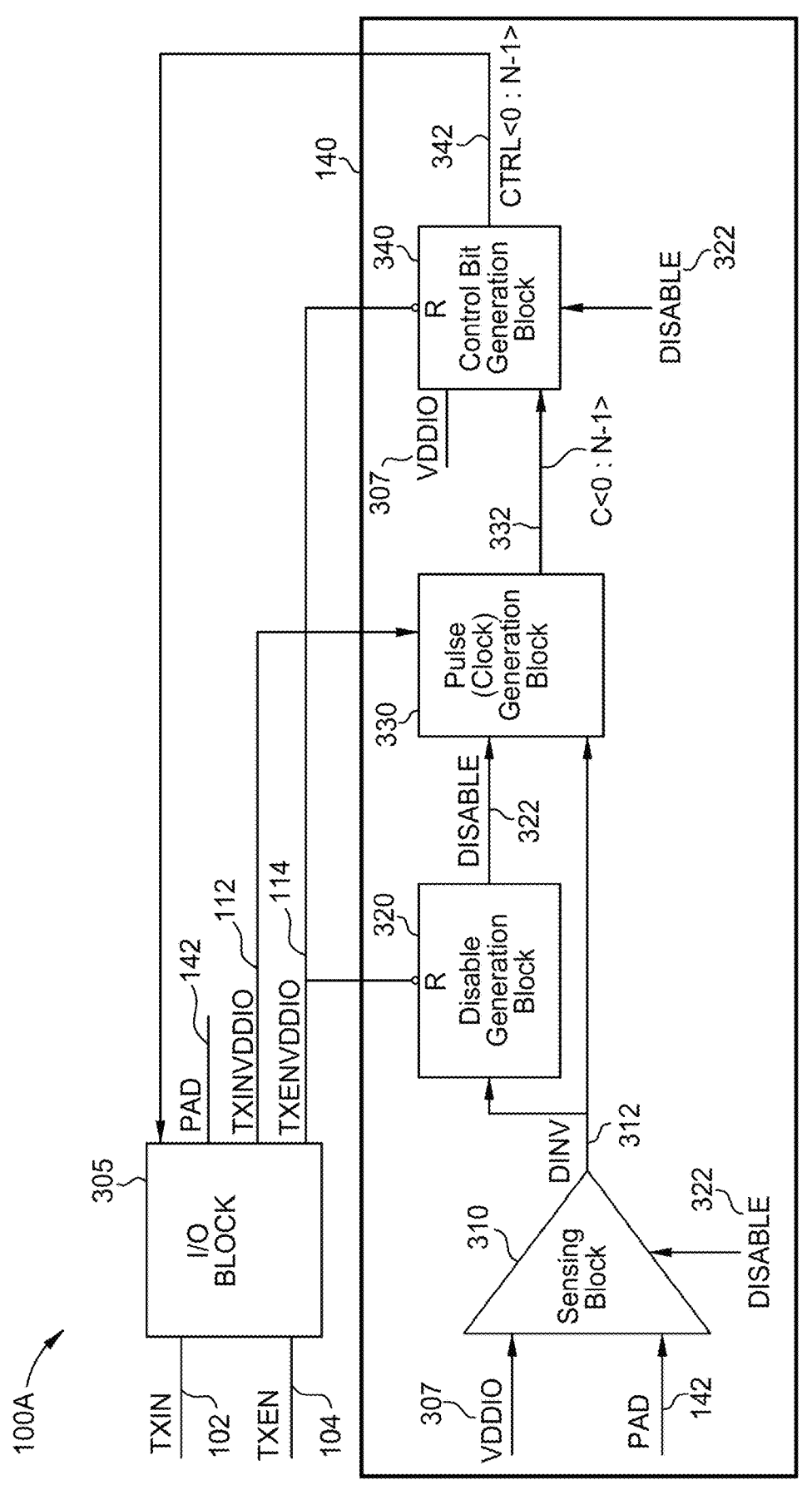
FIG. 3 illustrates the components of the load sensing and calibration circuit.

At block 230, the total time that it takes to sense a rising time of the data is measured in terms of a delay unit and converted into a pulse. The pulse (clock) generation block 330 (FIG. 3) includes a plurality of delay elements that help generate signals C0 to CN−1 (i.e., the control signals 740) used as clock input to the control bit generation block 340 (FIG. 3). The successive pulses C0, C1, C2 . . . keep on generating until the pad output reaches a threshold.

Figures 7, 8:
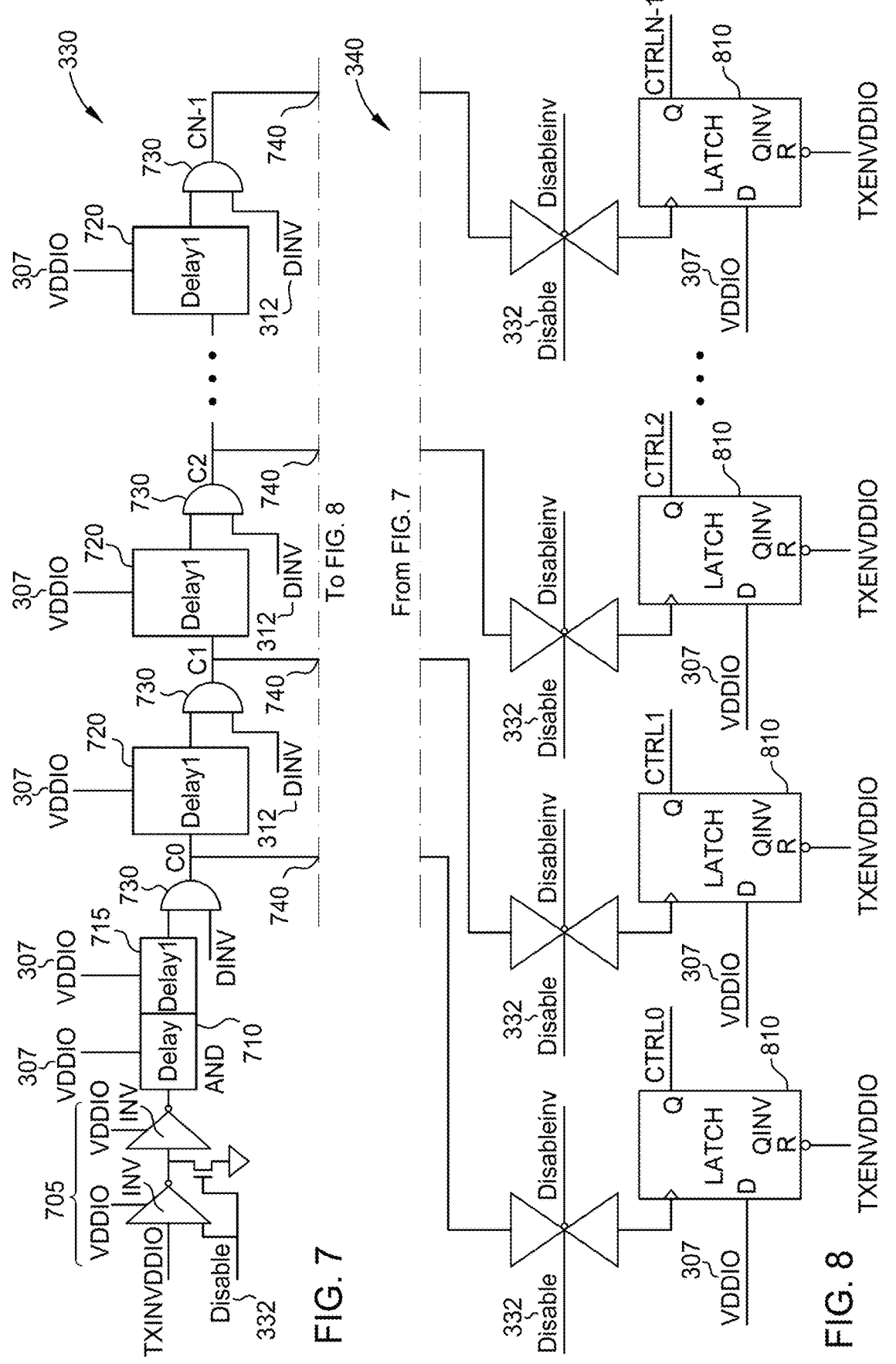
FIG. 7 illustrates pulse generation circuitry of the load sensing and calibration circuit.
FIG. 8 illustrates control bit generation circuitry of the load sensing and calibration circuit.

At control bit generation block 340, the pulse will latch the logic high, which will represent control bit/signals 125 fed back to the pre-drivers 120 and the drivers 130. The control signals 740 are latched to the latches 810 (FIG. 8). When the DINV signal 312 goes low, then the control signals 740 go low and the latching stops. As such, a first latch stores a first control signal (CTRL0), a second latch stores a second control signal (CTRL1), a third latch stores a third control signal (CTRL2), and so on. Once the control signals have been obtained (i.e., CTRL0, CTRL1, CTRL2 . . . CTRLN−1), they are fed to the drivers 130.

Figure 2B:
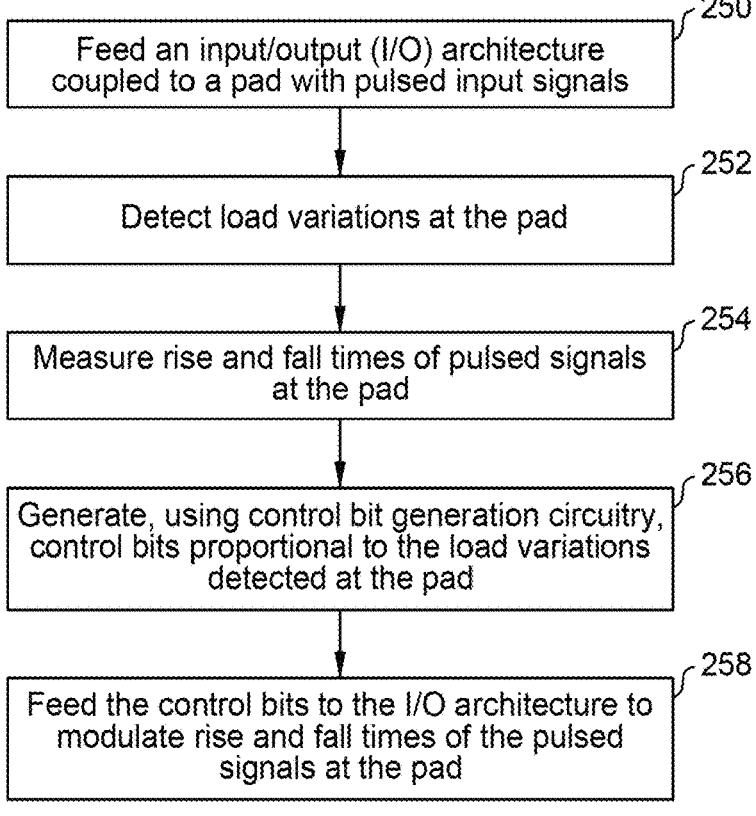
FIG. 2B illustrates a flowchart for modulating the rise and fall times of the pad load signals.

FIG. 2B illustrates a flowchart for modulating the rise and fall times of the pad load signals.

At block 250, an input/output (I/O) architecture coupled to a pad is fed with pulsed input signals.

At block 252, load variations at the pad are detected. Load variations can impact the performance and signal integrity of the I/O transmitter 100A. The load variations arise from different types of loads coupled to the pad 150. The load variations may include capacitive loads. Capacitive loads may slow down the rise and fall times of signals.

At block 254, rise and fall times of pulsed signals at the pad are measured. The rise and fall times may be measured by using oscilloscopes, probes, and/or test points. Shorter rise and fall times typically indicate better signal integrity, as the signal transitions are sharper and more defined. Longer rise and fall times may indicate issues such as excessive capacitive loading.

At block 256, control bits proportional to the load variations detected at the pad are generated using control bit generation circuitry. Generating control bits proportional to the load variations of the pad and feeding the control bits back to the drivers 130 creates a feedback system that dynamically adjusts the driver settings based on real-time load conditions. The control bits may adjust parameters such as drive strength, output impedance, and slew rate. The control bits are generated in real-time, or at a suitable interval, to keep up with the changes in the load conditions at the pad.

At block 258, the control bits are fed to the I/O architecture to modulate rise and fall times of the pulsed signals at the pad. The control bits adjust the driver parameters, such as drive strength, output impedance, and slew rate, which in turn modulate the rise and fall times of the pulsed signals at the pad 150. The drivers 130 may include a driver adjustment mechanism having fine granularity to enable precise processing of the rise and fall times. The latency in the feedback loop may be further minimized to ensure real-time adjustment of the driver parameters. Filtering and smoothing algorithms may also be implemented to handle noise and transient variations in the load measurements.

FIG. 3 illustrates the components of the load sensing and calibration circuit.

The I/O transmitter 100A depicts the components of the calibration circuit 140. The logic level shifter 110, the pre-drivers 120, and the drivers 130 are represented as I/O architecture 305. The I/O architecture 305 receives the first signal 102 and the second signal 104. The first signal 102 is the TXIN signal and the second signal 104 is the TXEN signal. The I/O architecture 305 outputs the first signal 112, which is the TXINVDDIO signal and the second signal 114, which is the TXENVDDIO signal.

The calibration circuit 140 includes a sensing block 310, a disable generation block 320, a pulse (clock) generation block 330, and a control bit generation block 340. The sensing block 310 can be referred to as sensing circuitry, the disable generation block 320 can be referred to as disable generation circuitry, the pulse (clock) generation block 330 can be referred to as pulse generation circuitry, and the control bit generation block 340 can be referred to as control bit generation circuitry.

The sensing block 310 senses the rise time of the pad and generates a signal designated as the DINV signal 312 (logically inverted to TXINVDDIO/pad). The sensing block 310 receives the rise and fall times 142 of the pad load and a VDDIO 307.

The disable generation block 320 generates the disable signal 322 to disable the sensing block 310 (e.g., to avoid any DC path) and resets the pulse C<0:N−1> signals. The disable signal 322 is provided to the sensing block 310 to stop to the sensing block 310 from further sensing because the control bit/signals 125 have been generated. The purpose of the disable generation block 320 is to disable the calibration process to prevent the sensing block 310, the pulse (clock) generation block 330, and the control bit generation block 340 from consuming any transients or DC current. To enable the calibration circuit 140, the TXEN signal (i.e., the second signal 104) is provided to the I/O architecture 305.

The pulse (clock) generation block 330 generates pulse signals (C<0:N−1>) by comparing the time delay difference between the DINV signal 312 and TXINVDDIO signal (i.e., the second signal 114) by using delay units.

The control bit generation block 340 uses C<0:N−1> signals as a clock and latches a logic high (i.e., the VDDIO 307) and generates control bits CTRL<0:N−1>, which will act as control bit/signals 125 for pre-drivers 120 (PDrv<0: N−1>) and the drivers 130 (D<0:N−1>). The disable signal 322 is provided to the control bit generation block 340 to stop to the control bit generation block 340 from producing further bits because the control bit/signals 125 have been generated.

Once the control bit/signals 125 have been generated to compensate for the load variations detected at the pad 150, the disable signal 322 is provided to the sensing block 310, the pulse (clock) generation block 330, and the control bit generation block 340 to disable such blocks to prevent further processing.

In summary, protocol standards have strict rise and fall time that are to be met. However, variations of the capacitive loads on the pad of the I/O transmitter can affect the rise and falls times. When the capacitive load on the pad 150 increases, more time is needed for the signal to change to its high state (rise time) and discharge to its low state (fall time). This is because capacitors resist changes in voltage, causing the signal to rise and fall more slowly. Excessive capacitance can distort the signal, causing slower transitions and potential timing errors, which can lead to signal degradation and increased jitter, as well as violate timing constraints set by standard protocols. However, the rise and fall times can be managed by making adjustments based on the detected load variations at the pad 150. The adjustments include generating control bits or signals proportional to the load variations, and feeding such control bits back to the pre-drivers 120 and the drivers 130 of the I/O transmitter 100A to modulate, in real-time, the rise and fall times of the pad signals. This enables the I/O transmitter 100A to support a wider range of capacitive loads at the pad 150. Thus, implementing such feedback mechanism ensures reliable and high-performance operation of the I/O transmitter 100A, while maintaining compliance with stringent protocol requirements.

Figures 4, 5, 6:
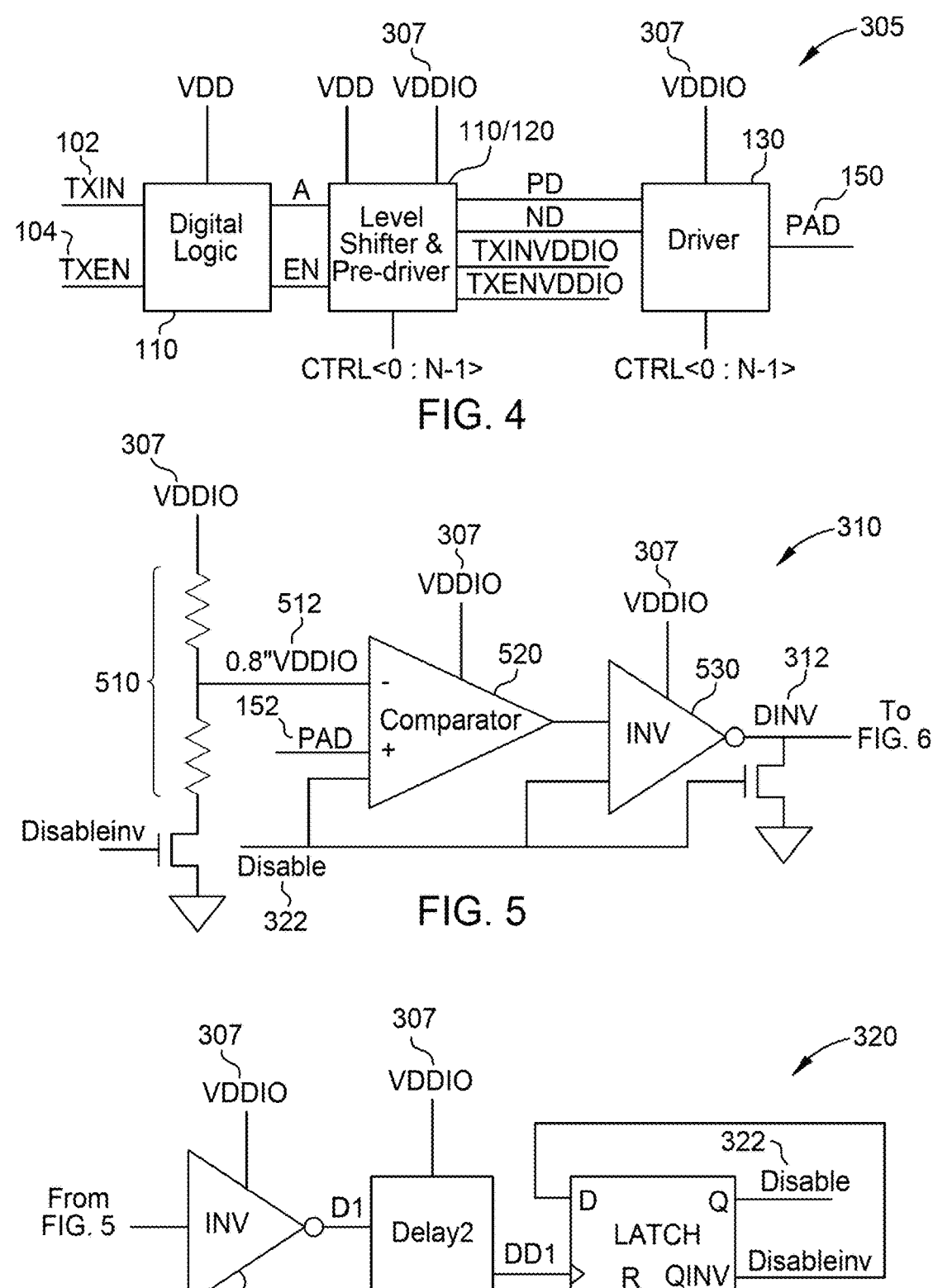
FIG. 4 illustrates an I/O architecture.
FIG. 5 illustrates sensing block circuitry of the load sensing and calibration circuit.
FIG. 6 illustrates disable generation circuitry of the load sensing and calibration circuit.

FIG. 4 illustrates an I/O architecture.

The I/O architecture 305 includes the logic level shifter 110 that receives the first signal 102 and the second signal 104. The first signal 102 is a TXIN signal and the second signal is a TXEN signal. The TXIN signal is a pulse input signal. The TXEN is a transmit enable control signal, which enables the I/O transmitter 100A. The logic level shifter 110 is split into digital logic and the level shifter. The logic level shifter 110 transmits two signals to pre-drivers 120. The first signal 112 is a TXINVDDIO signal and the second signal 114 is a TXENVDDIO signal. The TXINVDDIO signal is a level shifter version of the TXIN signal. The TXENVDDIO signal is a level shifter version of the TXEN signal. After the signals are processed by the pre-drivers 120, the signals are fed into the drivers 130. The drivers 130 transmit electrical signals through the pad 150 to other external circuits or devices. The pad 150 may also be referred to as an I/O pad or an interface pad.

The I/O transmitter 100A can handle load variations by using a pad transition sensor that generates gate control signals (i.e., control bit/signals 125), which are proportional to the load at the pad and fed to the pre-drivers 120 and the drivers 130 to modulate the rise and fall times of the I/O signals or pad signals. Stated differently, the proposed examples track the pad transition, which is depended on the load at the pad and generates a control bit/signal 125 fed back to the pre-drivers 120 and the drivers 130 of the I/O transmitter 100A to modulate the rise and fall times of the pad signals. This results in lowering the variability of the transition time and reducing the slew rate.

The rise and fall times vary for different protocols. As such, in order to accommodate multiple protocols, the rise and fall times resulting from pad load variations are continuously monitored and compensated by using the calibration circuit 140. Additionally, the slew rate can be controlled. "Slew" refers to the rate at which an electrical signal changes its voltage level over time and "slew rate" is a measure of how quickly a signal can transition from one voltage level to another. The slew rate is thus monitored and managed by using the calibration circuit 140.

FIG. 5 illustrates sensing block circuitry of the load sensing and calibration circuit.

The sensing block 310 has a resistor ladder 510 on the I/O supply (i.e., the VDDIO 307), a comparator 520 and an inverter 530. All these blocks are gated with disable signals 322 (generated from the pulse (clock) generation block 330) to avoid any DC current before and after calibration is performed by the calibration circuit 140.

A resistance ladder, also known as a resistor ladder or R-2R ladder, is an electrical circuit made up of resistors in a specific configuration. The resistor ladder 510 generates a reference signal 512. A reference value of the reference signal 512 depends on the rise time measurement threshold of given protocol standard. For example, for the RFFE protocol, the reference signal 512 may be 0.8*VDDIO. The resistor values may be adjusted to generate a different reference signal for other protocols.

The comparator 520 receives the reference signal 512 generated using the resistor ladder 510 and the load capacitance 152 as the other input. The output of sensing block 310 is the DINV signal 312, which is logically inverted to TXINVDDIO/PAD. The DINV signal 312 goes high to low once the pad crosses the reference signal 512. The reference signal 512 can be changed for supporting different protocol standards.

FIG. 6 illustrates disable generation circuitry of the load sensing and calibration circuit.

The disable generation block 320 has an inverter 610, a delay unit 620 (delay2) and a one bit counter 630. The delay unit 620 includes an AND gate delay, a multiplexer (MUX) delay, and a latch delay.

When TXENVDDIO (i.e., the second signal 114) goes low (i.e., I/O transmitter 100A is disabled), the disable signals 322 go high and the sensing block 310, the pulse (clock) generation block 330, and all the MUXs in control bit generation block 340 are disabled. When the TXENVDDIO (i.e., the second signal 114) goes high, the disable signals 322 go low. Once CTRL<0:N−1> are generated, the disable generation block 320 will generate the disable signal 322, which will disable the sensing block 310 to avoid any DC current path and will also disabled the pulse (clock) generation block 330 to avoid any dynamic current and disable all the MUXs in control bit generation block 340. Therefore, the disable generation block 320 ensures that there is no DC current before and after calibration is performed by the calibration circuit 140. When the I/O transmitter 100A is disabled, all calibration bits are reset and the calibration resumes once the TXEN (i.e., the second signal 104) and TXENVDDIO (i.e., the second signal 114) go high.

FIG. 7 illustrates pulse generation circuitry of the load sensing and calibration circuit.

The pulse generation block 330 has a buffer 705, a Delay unit 710, Delay1 units 715 and a series of Delay1 elements 720, as well as logic AND gates 730. The delay of the Delay unit 710 is equivalent to the delay from the TXIN to the TXINVDDIO in the I/O architecture 305. The delay of the Delay1 unit 715 is equivalent to a max rise time measured with the unit driver enable divided by $2^n$, where n is no control bits. The output of the Delay1 elements 720 is logically ANDed (AND gates 730) with the DINV signal 312 to generate signal C0 to CN−1 (i.e., the control signals 740) used as clock input to the control bit generation block 340. The successive pulses C0, C1, C2 . . . keep on generating until the pad output reaches a threshold (i.e., the reference signal 512), which may be, e.g., 0.8*VDDIO. As soon as this occurs, the DINV signal 312 goes low and the disable signal 332 is generated by disable generation block 320 and the process stops. The threshold may be determined by the protocol standard used. In other words, the protocol standard may dictate where to set the threshold for the pad load variations.

FIG. 8 illustrates control bit generation circuitry of the load sensing and calibration circuit.

The control bit generation block 340 uses C<0:N−1> signals as a clock and latches (via latches 810) a logic high (i.e., VDDIO 307) and generates CTRL<0:N−1>, which will act as control bit/signals 125 for pre-drivers 120 (PDrv<0:N−1>) and the drivers 130 (D<0:N−1>). Each control bit/ signal 125 is associated with a respective latch of the latches 810. Using the latches 810 to store each control bit/signal 125 in a feedback system for modulating the rise and fall times of pulsed signals involves setting up the delay unit and latch mechanism of FIG. 8. The control bit/signal 125 stored in the latches 810 are used to dynamically adjust the driver parameters of the drivers 130. In this example, D-type latches may be used to store the control bit/signal 125. The latches 810 may be updated with new control bits at each clock cycle or whenever a new load value is detected. A clock signal may be used to synchronize the latches 810.

Figure 9A:
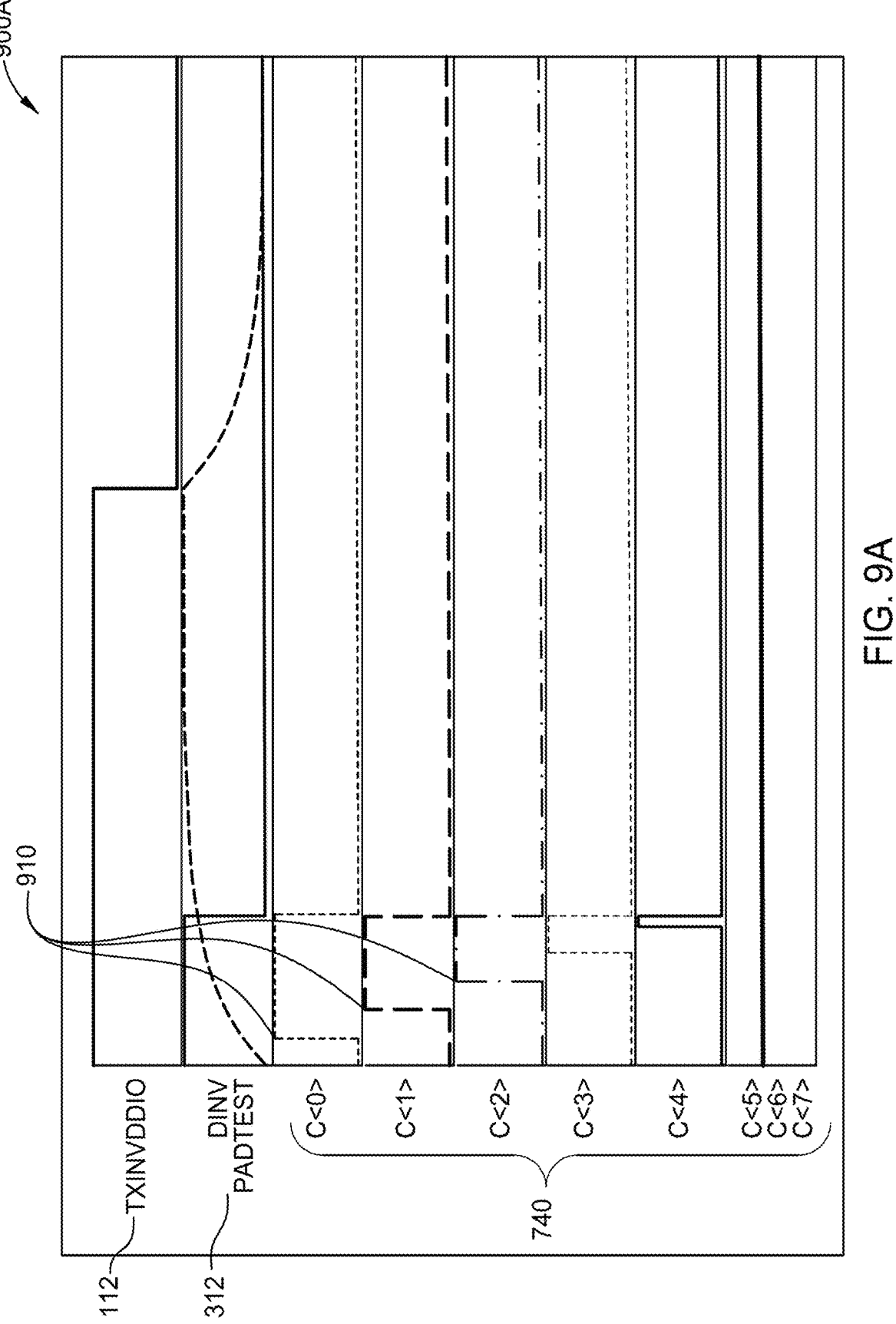
FIGS. 9A-9C illustrate graphs for generating control bit/signals that are fed back to the pre-drivers and the drivers of the I/O transmitter of FIG. 1A.
Figure 9B:
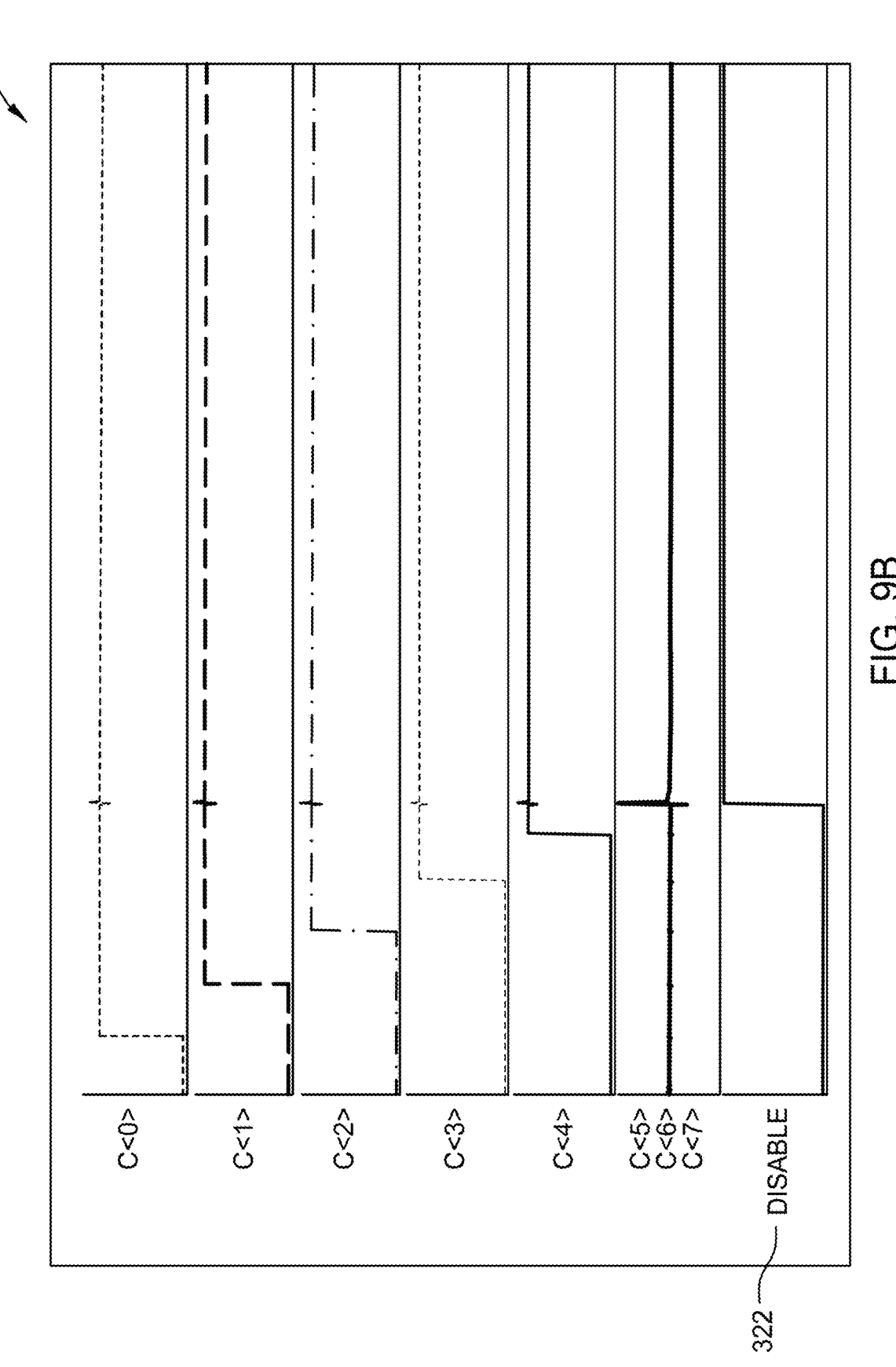
Figure 9C:
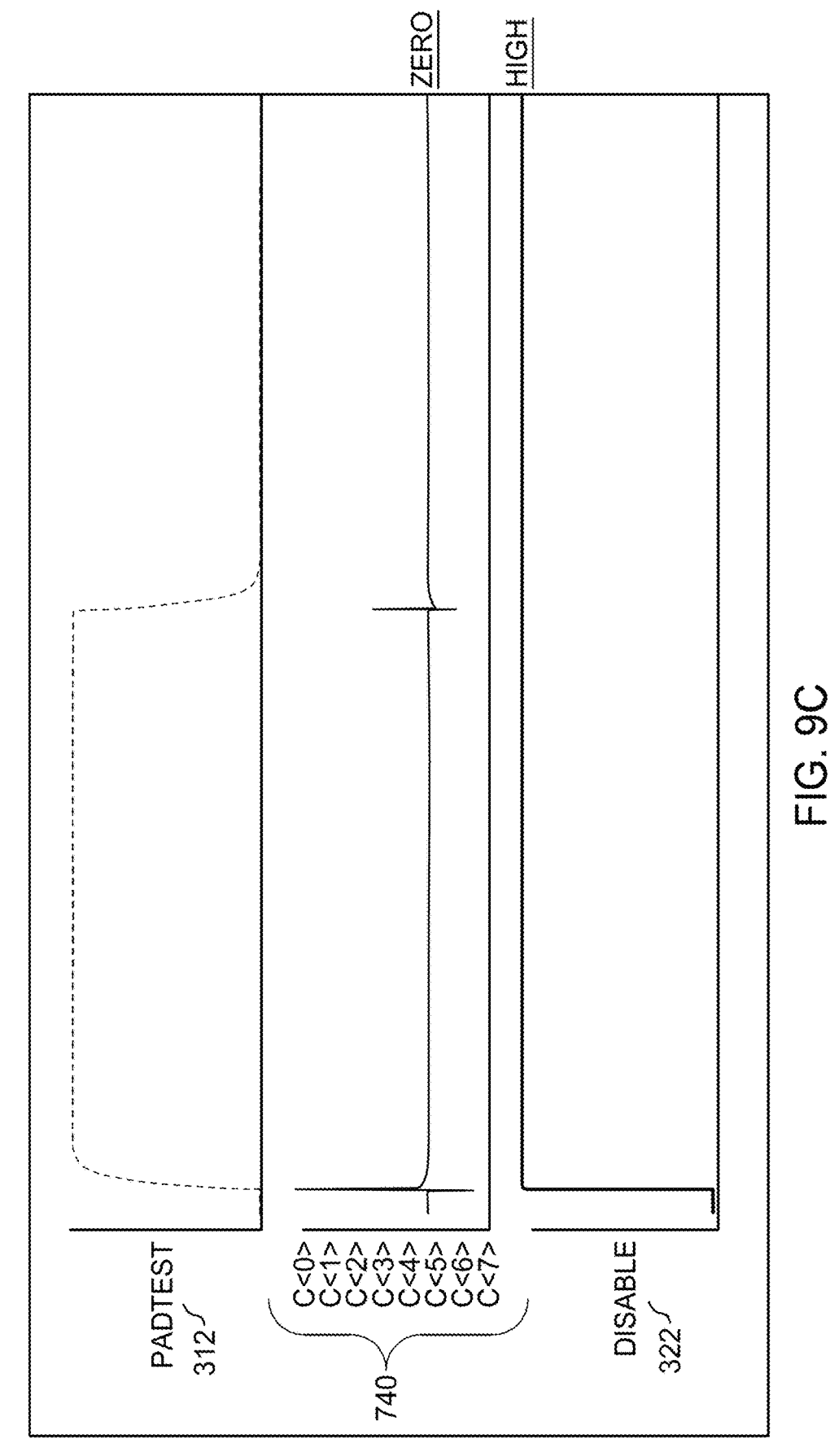

FIGS. 9A-9C illustrate graphs for generating control bit/signals that are fed back to the pre-drivers and the drivers of the I/O transmitter of FIG. 1A.

Graph 900A of FIG. 9A depicts the TXINVDDIO signal (i.e., the first signal 112) output by the I/O architecture 305 (FIG. 3). The TXINVDDIO signal is a pulse. Graph 900A also depicts the DINV signal 312, which gradually rises to the level of the TXINVDDIO signal. When the TXINVDDIO signal is disabled, the DINV signal 312 starts to taper off and also becomes disabled. By logically ANDing the TXINVDDIO signal and the DINV signal 312, control signals C0 to CN−1 (i.e., the control signals 740) are generated. The control signals 740 are pulses. C<0> has a first pulse with, C<1> has a second pulse width, C<2> has a third pulse width, and so on. Each successive pulse has a smaller width. In other words, C<0> has a greater pulse width than C<1>, C<1> has a greater pulse width than C<2>, and so on. The delay elements (i.e., Delay unit 710, Delay1 units 715 and a series of Delay1 elements 720) cause the different pulse widths. Stated differently, the delay elements delay the rising edge 910 of the control signals 740 to generate the sequence of control signals with delayed rising edges. The control signals 740 are generated because there is a load variation at the pad 150. For example, the load may have been increased at the pad 150.

The control signals 740 are then latched to the latches 810 of FIG. 8. When the DINV signal 312 goes low, then the control signals 740 go low and the latching stops. As such, the first latch stores the first control signal (CTRL0), the second latch stores the second control signal (CTRL1), the third latch stores the third control signal (CTRL2), and so on. Once the control signals have been obtained (i.e., CTRL0, CTRL1, CTRL2 . . . CTRLN−1), they are fed to the drivers 130.

Graph 900B of FIG. 9B depicts the control signals 740 being latched to the latches 810 of FIG. 8. As such, the first latch stores the first control signal (CTRL0), the second latch stores the second control signal (CTRL1), the third latch stores the third control signal (CTRL2), and so on. Once the control signals have been obtained (i.e., CTRL0, CTRL1, CTRL2 . . . CTRLN−1), they are fed to the drivers 130. Therefore, in FIG. 9A, the control signals 740 are generated due to detected or measured load variations and in FIG. 9B, the control signals are stored in the latches 810 of FIG. 8. The stored control signals are then fed back into the pre-drivers 120 and the drivers 130 to modulate the rise and fall times of the I/O signals at the pad load. Therefore, the control signals 740 are proportional to the load at the pad (e.g., the adjusted load) and are fed to the pre-drivers 120 and the drivers 130.

Graph 900C of FIG. 9C depicts the DINV signal 312 and the disable signal 322. The default driver is sufficient to drive the min load and hence all the control signals 740 are zero, and the disable signal 322 is generated immediately. In other words, the drivers 130 determine that the pad load variation has been sufficiently accounted for based on the control signals 740 generated thus far (threshold has been met based on protocol standard used), which triggers the disable signal 322 to go high and resets the controls signals 740 to zero.

With reference to FIGS. 1A-9, providing pad load compensation to an I/O transmitter on a PCB to support a wide range of capacitive loads offers several advantages that enhance the performance, reliability, and longevity of a device. Such advantages may include enhanced reliability, better thermal management, improved signal integrity, improved solder joint quality, component protection, board integrity, extended lifespan, performance consistency, and cost efficiency.

Better thermal management may include reduced overheating, as pad load compensation helps dissipate heat, prevents overheating of the pad, the PCB, and nearby components. Better thermal management may further include thermal stability to reduce thermal cycling and associated thermal fatigue, extending the lifespan of the I/O transmitter.

Improved signal integrity includes maintaining consistent impedance, which is beneficial for high-frequency signal integrity. Improved signal integrity further includes reducing noise and crosstalk. Minimizing physical deformation and maintaining proper spacing helps reduce electrical noise and crosstalk between signals, ensuring clearer and more reliable signal transmission.

In conclusion, the example embodiments employ a pad transition sensor to generate control bits or signals proportional to the load of the pad of the I/O transmitter to support a wider range of capacitance load at the pad, to compensate for process variations, to lower modulated transition times, provide flexibility to support multiple protocols, prevent DC current once calibration has been completed, and further to reduce of voltage and temperature variability. The example embodiments provide for an I/O transmitter that can handle load variations by using a pad transition sensor that generates gate control bits or signals, which are proportional to the load at the pad and are fed to the pre-drivers and drivers of the I/O architecture to modulate the rise and fall times of the I/O signals. This results in at least lowering the variability of the transition time and reducing the slew rate.

Figure 10:
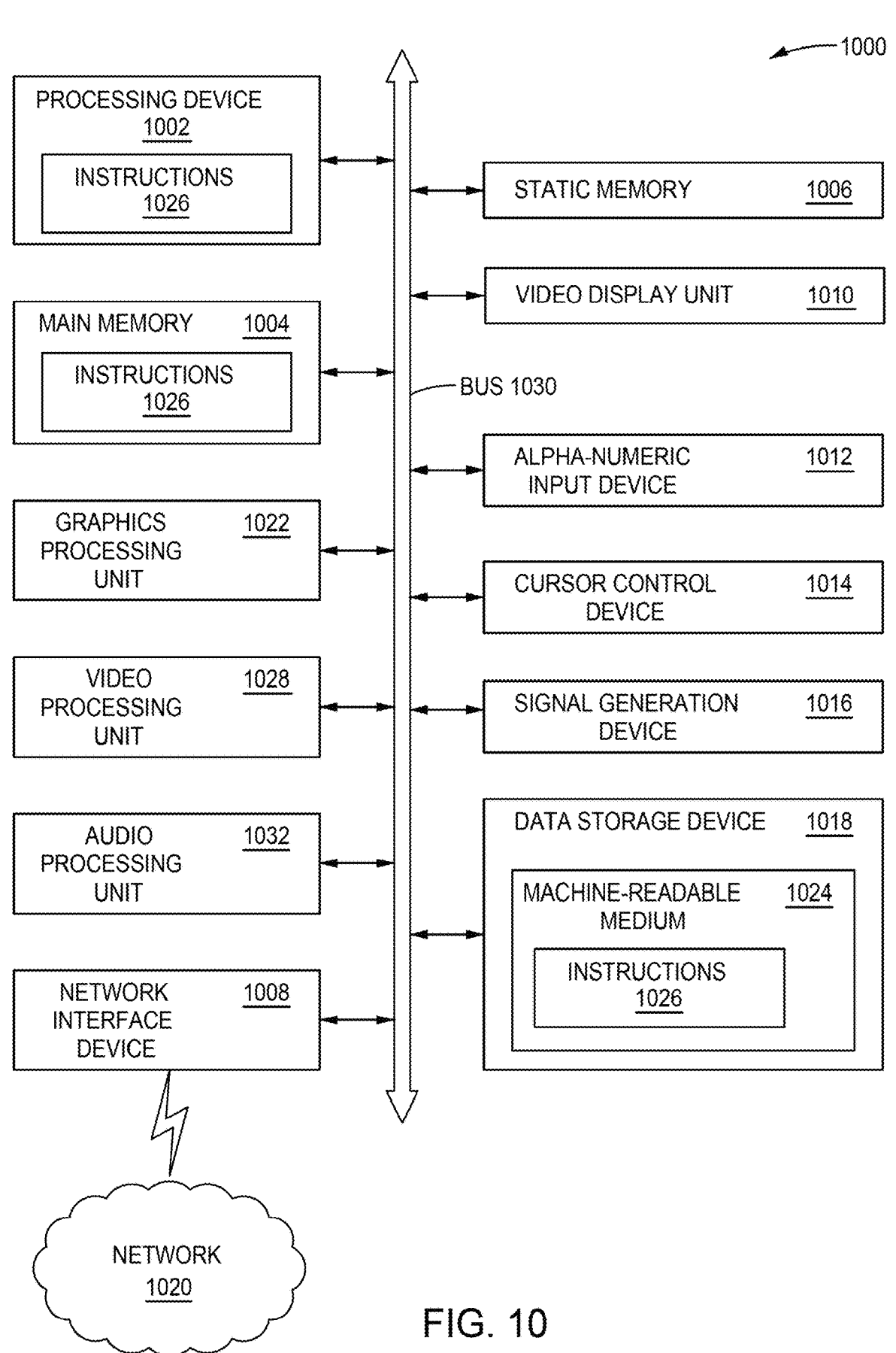
FIG. 10 illustrates an example computer system in which embodiments of the present disclosure may operate.

FIG. 10 illustrates an example computer system in which embodiments of the present disclosure may operate.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a local area network (LAN), an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

The present disclosure presents systems and methods for load compensation that support a wide range of capacitive loads on a pad coupled to an I/O transmitter.

In one example, a I/O transmitter includes a I/O architecture coupled to a pad and a calibration circuit coupled to the I/O architecture. The calibration circuit includes sensing circuitry, pulse generation circuitry coupled to the sensing circuitry and control bit generation circuitry coupled to the pulse generation circuitry. The control bit generation circuitry generates control bits proportional to load variations detected at the pad and feeds the control bits to the I/O architecture to modulate rise and fall times of pulsed signals at the pad.

In another example, a calibration circuit includes sensing circuitry, pulse generation circuitry coupled to the sensing circuitry, and control bit generation circuitry coupled to the pulse generation circuitry. The control bit generation circuitry generates control bits proportional to load variations detected at a pad of a device to modulate rise and fall times of pulsed signals input to the device.

In yet another example, a method includes feeding an input/output (I/O) architecture coupled to a pad with pulsed input signals, detecting load variations at the pad, measuring rise and fall times of pulsed signals at the pad, generating, using control bit generation circuitry, control bits proportional to the load variations detected at the pad, and feeding the control bits to the I/O architecture to modulate rise and fall times of the pulsed signals at the pad.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementation of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A input/output (I/O) transmitter comprising:

I/O architecture coupled to a pad; and a calibration circuit coupled to the I/O architecture, the calibration circuit including:

sensing circuitry including a resistor ladder coupled to a comparator, wherein the resistor ladder generates a reference signal and the comparator detects when a voltage at the pad crosses the reference signal;

pulse generation circuitry coupled to the sensing circuitry, the pulse generation circuitry including a plurality of serial delay elements that generate a sequence of time-offset pulses until the comparator detects that the voltage at the pad crosses the reference signal; and control bit generation circuitry coupled to the pulse generation circuitry, wherein the control bit generation circuitry generates control bits based on a duration between initiation of a pad transition and detection of the reference signal crossing and feeds the control bits to the I/O architecture to modulate rise and fall times of pulsed signals at the pad.

2. The I/O transmitter of claim 1, wherein the I/O architecture includes a logic level shifter, pre-drivers, and drivers, wherein the pre-drivers and the drivers receive the control bits generated by the control bit generation circuitry to modulate the rise and fall times of the pulsed signals at the pad.

3. The I/O transmitter of claim 1, wherein the sensing circuitry is gated with disable signals to prevent direct current (DC) before and after calibration is performed by the calibration circuit.

4. The I/O transmitter of claim 1, wherein the resistor ladder generates the reference signal based on a rise time measurement threshold of an interface protocol.

5. The I/O transmitter of claim 1, wherein the plurality of serial delay elements generate sequential pulses that are gated by an output of the comparator such that generation of the pulses stops when the voltage at the pad crosses the reference signal.

6. The I/O transmitter of claim 5, wherein the sequential pulses generated by the plurality of serial delay elements are provided to a plurality of latches that capture and store the pulses prior to termination of the pulse generation.

7. The I/O transmitter of claim 1, wherein the calibration circuit further includes disable generation circuitry to disable the sensing circuitry and the control bit generation circuitry when modulation of the rise and fall times of the pulsed signals at the pad is complete.

8. The I/O transmitter of claim 7, wherein the disable generation circuitry includes an inverter, a delay element, and a one-bit counter.

9. The I/O transmitter of claim 1, wherein the control bit generation circuitry includes a plurality of latches for storing a respective control bit.

10. A calibration circuit comprising:

sensing circuitry including a resistor ladder coupled to a comparator, wherein the resistor ladder generates a reference signal and the comparator detects when a voltage at the pad crosses the reference signal;

pulse generation circuitry coupled to the sensing circuitry, the pulse generation circuitry including a plurality of serial delay elements that generate a sequence of time-offset pulses until the comparator detects that the voltage at the pad crosses the reference signal; and control bit generation circuitry coupled to the pulse generation circuitry, wherein the control bit generation circuitry generates control bits based on a duration between initiation of a pad transition and detection of the reference signal crossing to modulate rise and fall times of pulsed signals input to the device.

11. The calibration circuit of claim 10, wherein the sensing circuitry is gated with disable signals to prevent direct current (DC) before and after calibration is performed by the calibration circuit.

12. The calibration circuit of claim 10, wherein the resistor ladder generates the reference signal based on a rise time measurement threshold of an interface protocol.

13. The calibration circuit of claim 10, wherein the plurality of serial delay elements generate sequential pulses that are gated by an output of the comparator such that generation of the pulses stops when the voltage at the pad crosses the reference signal.

14. The calibration circuit of claim 13, wherein the sequential pulses generated by the plurality of serial delay elements are provided to a plurality of latches that capture and store the pulses prior to termination of the pulse generation.

15. The calibration circuit of claim 10, wherein the calibration circuit further includes disable generation circuitry to disable the sensing circuitry and the control bit generation circuitry when modulation of the rise and fall times of the pulsed signals at the device is complete.

16. The calibration circuit of claim 15, wherein the disable generation circuitry includes an inverter, a delay element, and a one-bit counter.

17. The calibration circuit of claim 10, wherein the control bit generation circuitry includes a plurality of latches for storing a respective control bit.

18. A method comprising:

feeding an input/output (I/O) architecture coupled to a pad with pulsed input signals;

detecting load variations at the pad by generating a reference signal using a resistor ladder and detecting, using a comparator, when a voltage at the pad crosses the reference signal;

measuring rise and fall times of pulsed signals at the pad by generating, using a plurality of serial delay elements, a sequence of time-offset pulses until the comparator detects that the voltage at the pad crosses the reference signal;

generating, using control bit generation circuitry, control bits based on a duration between initiation of a pad transition and detection of the reference signal crossing; and feeding, using a calibration circuit, the control bits to the I/O architecture to modulate rise and fall times of the pulsed signals at the pad.

19. The method of claim 18, wherein the sensing circuitry is gated with disable signals to prevent direct current (DC) before and after calibration is performed by the calibration circuit coupled to the I/O architecture.

20. The method of claim 19, further comprising disabling, using disable generation circuitry, the sensing circuitry and the control bit generation circuitry when modulation of the rise and fall times of the pulsed signals at the pad is complete.

* * * * *